United States Patent [19]

Wong et al.

[11] Patent Number: 5,776,615
[45] Date of Patent: Jul. 7, 1998

[54] SUPERHARD COMPOSITE MATERIALS INCLUDING COMPOUNDS OF CARBON AND NITROGEN DEPOSITED ON METAL AND METAL NITRIDE, CARBIDE AND CARBONITRIDE

[75] Inventors: Ming-Show Wong, Northbrook; Dong Li, Evanston; Yip-Wah Chung, Wilmette; William D. Sproul, Palantine; Xi Chu; Scott A. Barnett, both of Evanston, all of Ill.

[73] Assignee: Northwestern University, Evanston, Ill.

[21] Appl. No.: 388,020

[22] Filed: Feb. 14, 1995

Related U.S. Application Data

[63] Continuation-in-part of Ser. No. 973,390, Nov. 9, 1992.
[51] Int. Cl.[6] .................................. C23C 14/06
[52] U.S. Cl. .......................... 428/698; 428/469; 428/472; 428/356; 428/217; 428/212
[58] Field of Search ........................ 428/698, 212, 428/217, 336, 472, 469

[56] References Cited

U.S. PATENT DOCUMENTS

| | | |
|---|---|---|
| 4,664,976 | 5/1987 | Kimura et al. ............... 428/336 |
| 5,110,679 | 5/1992 | Haller et al. ................. 428/698 |
| 5,405,515 | 4/1995 | Fang ............................ 204/164 |
| 5,441,624 | 8/1995 | Chan et al. ................... 427/580 |

OTHER PUBLICATIONS

Mirkarimi et al., "Enhanced hardness in lattice-matched single-crystal $TiN/V_{0.6}Nb_{0.4}N$ superlattices;" Appl. Phys. Lett 57 (25), Dec. 17, 1990, pp. 2654–2656.

Helmerson et al., "Growth of single-crystal TiN/VN strained-layer superlattices with extremely high mechanical hardness;" J. Appl. Phys. 62(2), Jul. 15, 1987, pp. 481–484.

Primary Examiner—Archene Turner
Attorney, Agent, or Firm—Banner & Witcoff, Ltd.

[57] ABSTRACT

A composite material having high hardness comprises a carbon nitrogen compound, such as $CN_x$ where x is greater than 0.1 and up to 1.33, deposited on a metal or metal compound selected to promote deposition of substantially crystalline $CN_x$. The carbon nitrogen compound is deposited on a crystal plane of the metal or metal compound sufficiently lattice-matched with a crystal plane of the carbon nitrogen compound that the carbon nitrogen compound is substantially crystalline. A plurality of layers of the compounds can be formed in alternating sequence to provide a multi-layered, superlattice coating having a coating hardness in the range of 45–55 GPa, which corresponds to the hardness of a BN coating and approaches that of a diamond coating.

11 Claims, 8 Drawing Sheets

The variation of coating hardness as a function of substrate rotation speed.

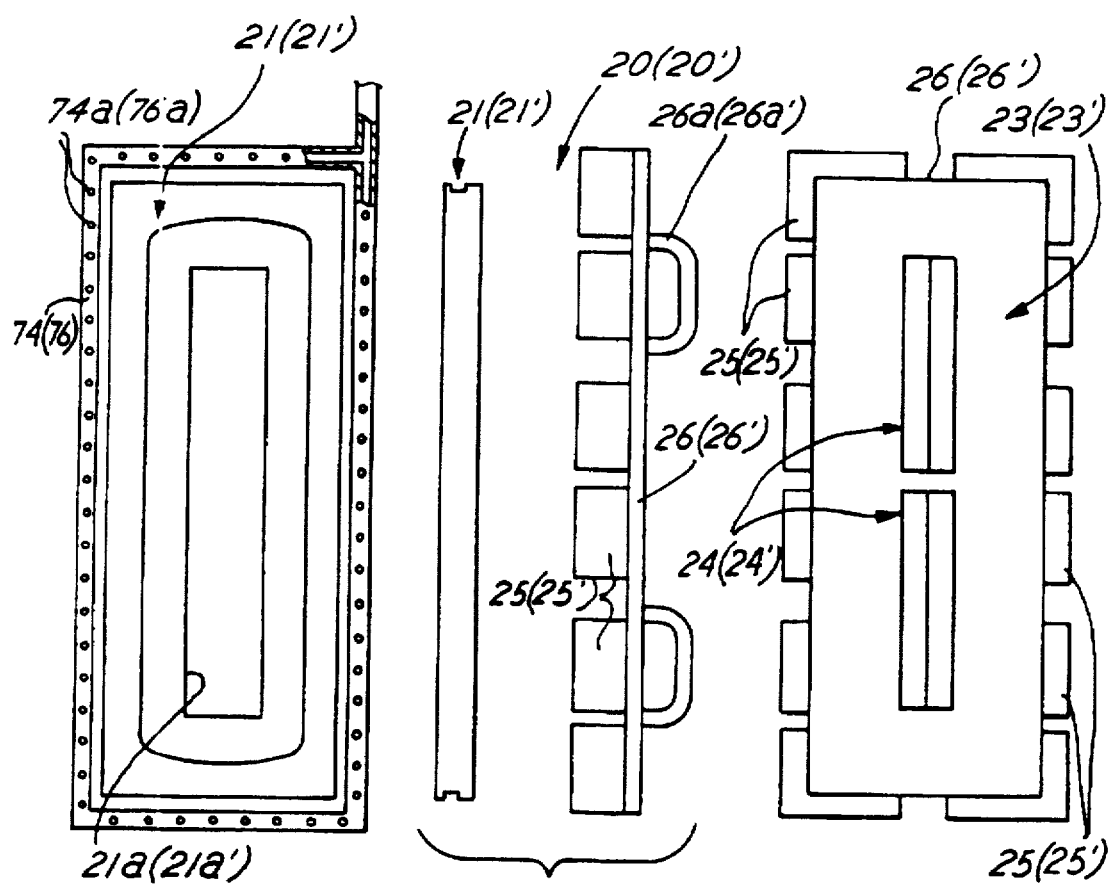

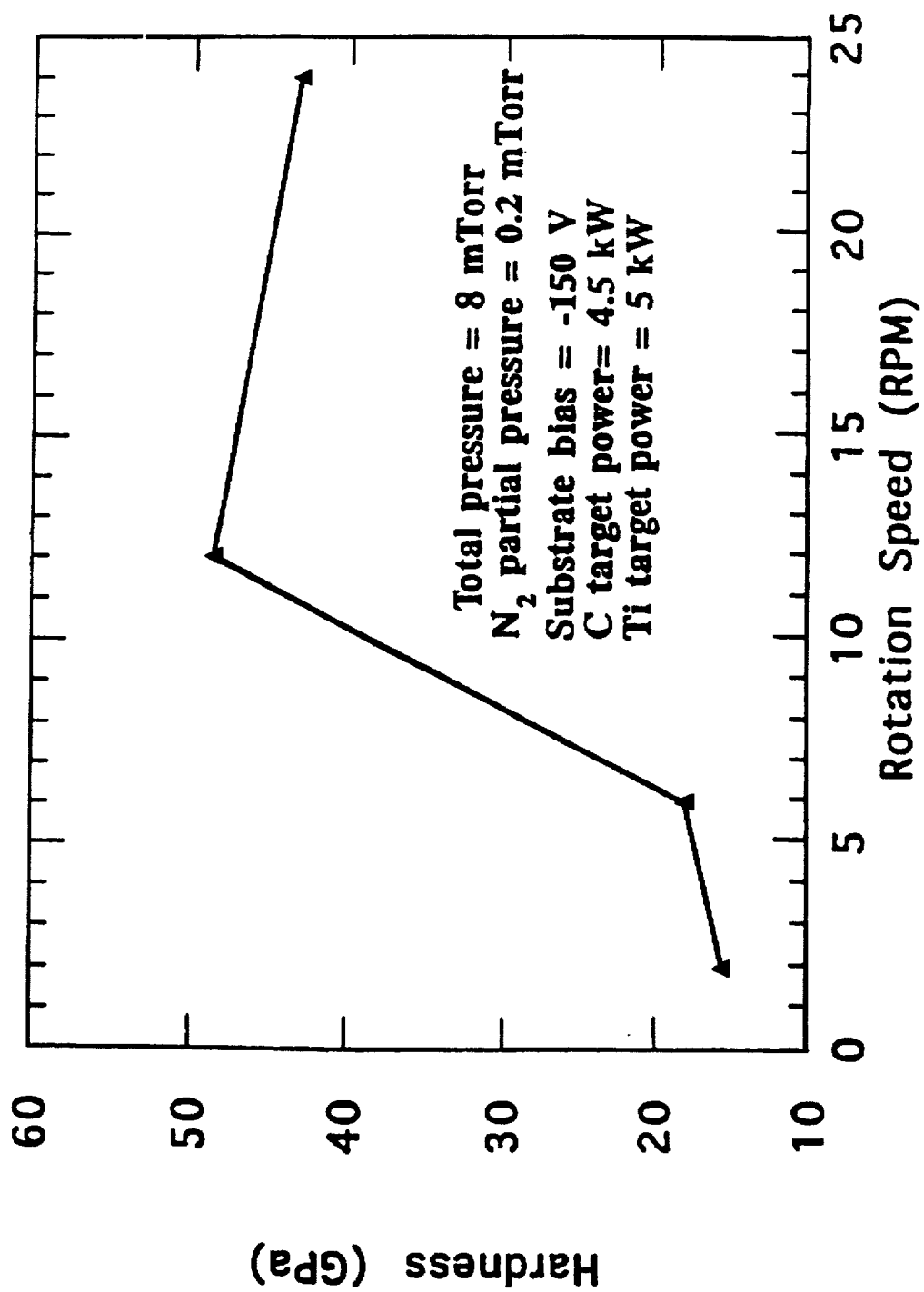
Fig. 6  The variation of coating hardness as a function of substrate rotation speed.

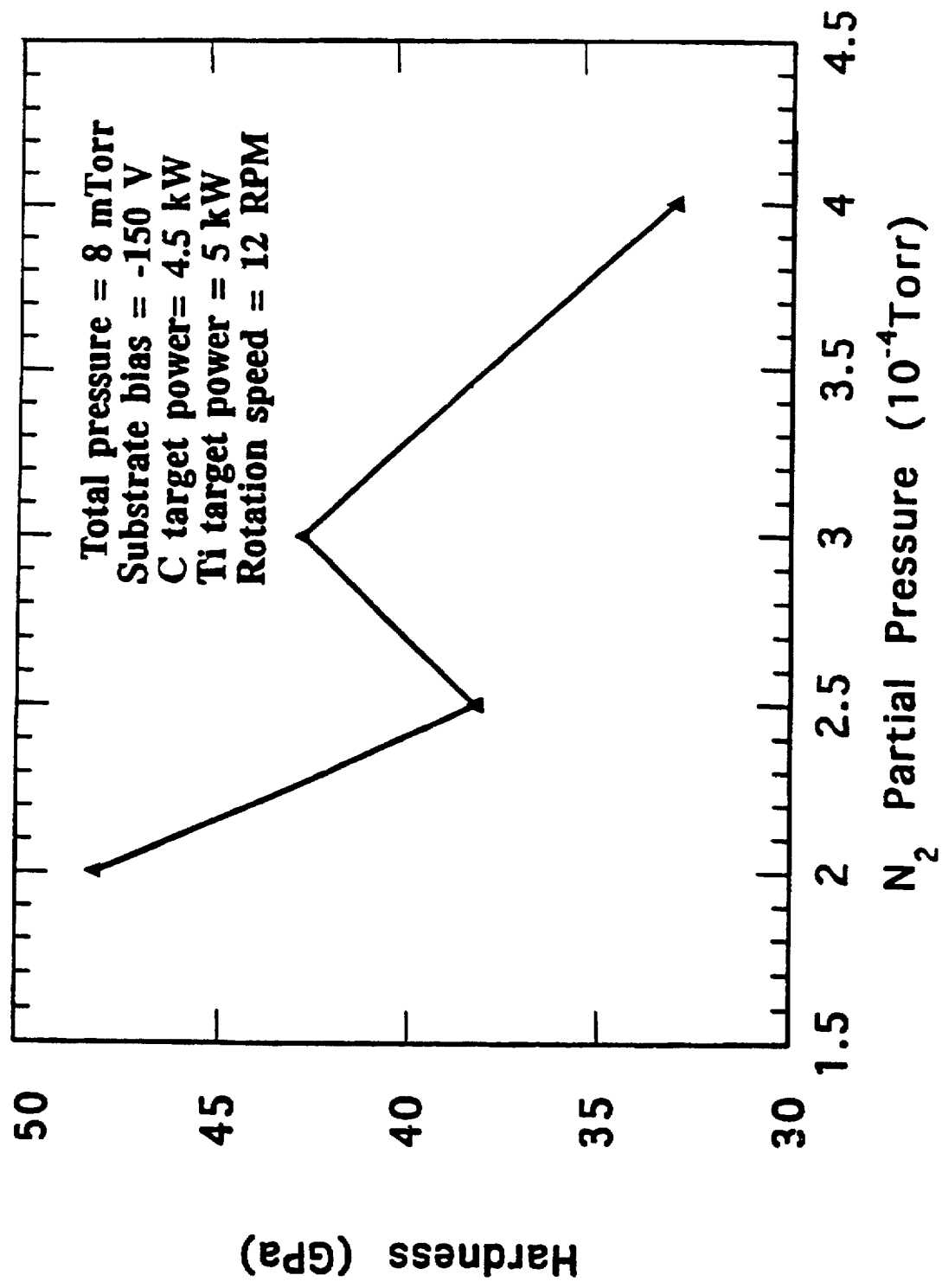
Fig. 7 The variation of coating hardness as a function of $N_2$ partial pressure.

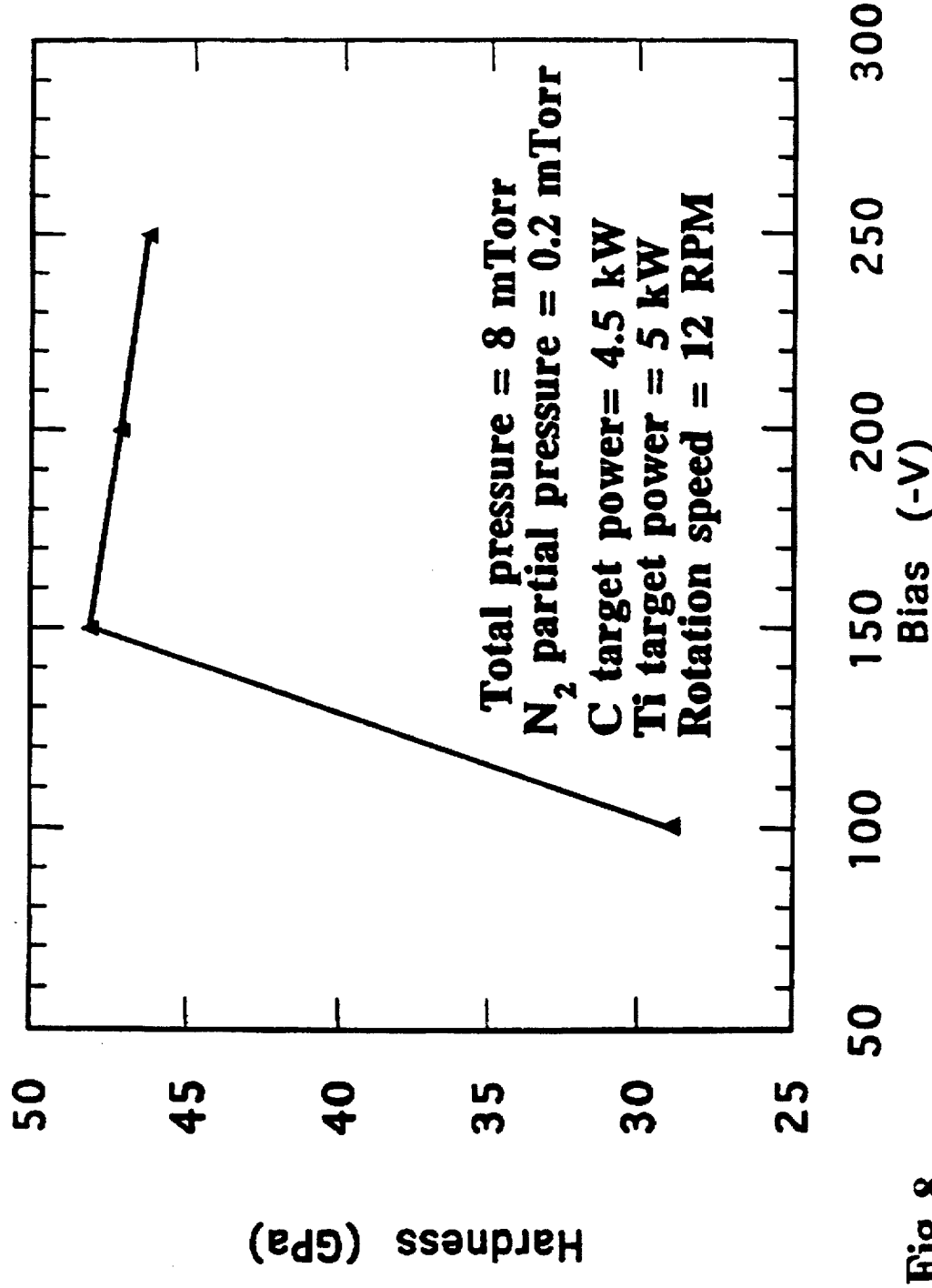
Fig.8 The variation of coating hardness as a function of substrate bias voltage.

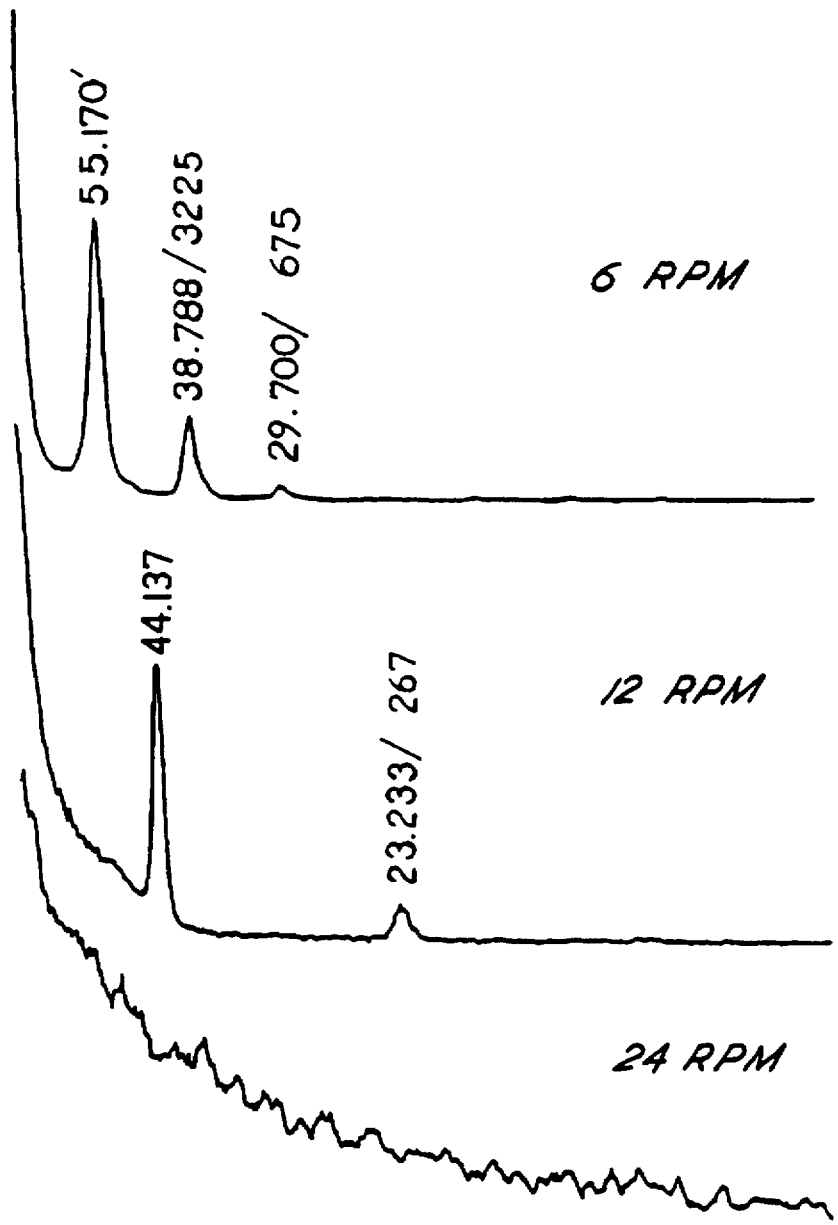
Fig. 9 Low angle XRD pattern of samples prepared under different rotation speed total pressure = 8 mTorr,
$N_2$ partial pressure = 0.2 mTorr,
Substrate bias = -150 V,
C target power= 4.5 kW
Ti target power = 5 kW.
Rotation speed = 12 RPM

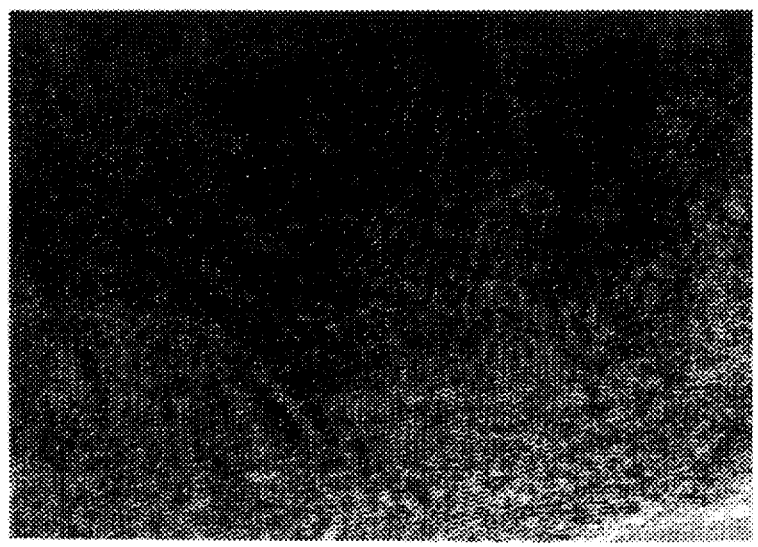
5 nm
Fig. 10 High-resolution cross-sectional TEM picture of the sample prepared under total pressure = 8 mTorr, $N_2$ partial pressure = 0.2 mTorr, substrate bias = -150 V, C target power = 4.5 kW, Ti target power = 5 kW, and table rotation speed = 12 rpm.

SUPERHARD COMPOSITE MATERIALS INCLUDING COMPOUNDS OF CARBON AND NITROGEN DEPOSITED ON METAL AND METAL NITRIDE, CARBIDE AND CARBONITRIDE

This application is a continuation-in-part of Ser. No. 07/973,390 filed Nov. 9, 1992 pending.

CONTRACTURAL ORIGIN OF THE INVENTION

This invention was made with Government support under Grant Number: NSF MSS-9203239 awarded by the National Science Foundation and DEFG02-90ER45434 awarded by the U.S. Department of Energy. The Government may have certain rights in the invention.

FIELD OF THE INVENTION

The present invention relates to superhard composite materials that exhibit hardness approaching that of diamond coatings and that include to this end compounds of carbon and nitrogen (e.g. $CN_x$) deposited on metals and metal compounds as well as a method for making such superhard composite materials.

BACKGROUND OF THE INVENTION

There has been an upsurge in interest in the synthesis and characterization of carbon nitride as a result of the theoretical work by Liu and Cohen in Science, 245, 841 (1989) and Physical Review, B41, 10727 (1990). They predicted that, if beta-$C_3N_4$ exists, its bulk modulus should be comparable to that of diamond.

While there have been several reports in the literature as to synthesis of crystalline carbon nitride, evidence of actual synthesis of the compound has been inconclusive, and there has been no hardness data included in the reports. Previous attempts to synthesize carbon nitride appear to have resulted in the production of amorphous carbon nitride films or coatings, for example, $CN_x$ where x typically is 0.2 to 0.3 and sometimes up to 0.8 to 1.0, as compared to the stoichiometric atomic composition of beta-$C_3N_4$ where x is equal to 1.33.

For example, after the initial publication of the aforementioned Liu and Cohen articles, several high pressure techniques to synthesize crystalline beta-$C_3N_4$ were reported in J. Am. Ceram. Soc. 74, 1686 (1991), J. Am. Ceram. Soc. 73, 1686 (1990), and J. Mat. Sci. Lett. 9, 1376 (1990). No conclusive evidence was reported for production of crystalline beta-$C_3N_4$, however. Other researchers pursued various low pressure techniques. For example, Xiong et al. in Proc. MRC Symp. 280, 587 (1993) sythesized amorphous $CN_x$ films using laser ablation of a graphite target in a nitrogen atmosphere (pressure approximately 0.02 to 0.1 Torr) and found that these films were amorphous according to electron microscopy, inert to acid attack, and wear-resistant. Chubaci et al. in Nucl. Instr. and Meth. B80/81, 463 (1993) adopted an alternative scheme by delivering carbon and nitrogen species to the substrate surface independently; e.g. carbon by electron beam evaporation and nitrogen from an ion source. They found that the resulting films were amorphous according to X-ray diffraction and that these films were very hard (Knoop hardness up to 6500 kg/mm$^2$) with nitrogen-to-carbon ratio on the order of one. More recent studies by the same researchers in J. Appl. Phys. 76, 3791 (1994) showed the direct correlation between film hardness and the amount of chemically bound nitrogen. Niu et al. in Science 261, 334 (1993) used simultaneous laser ablation of a grahite target and a nitrogen atomic beam from an rf source. They reported the production of nanocrystallites and reported these to be beta-$C_3N_4$ based on d-spacing measurements from transmisson electron diffraction. Yu et al. in Physical Review B49, 5034 (1994) used rf sputtering of graphite in pure nitrogen onto hot silicon substrates (400–600 degrees C.) and reported the production of micron-sized crystallites which were concluded to be beta-$C_3N_4$ based on transmission electron diffraction measurements.

However, the identification of new phases solely by electron or X-ray diffraction can be misleading. For example, the strong lines reported by Niu et al. can be better matched to lonsdaleite or other graphite phases. Moreover, iron and water are possible contaminants in sputtering and can result in formation of iron oxide hydroxide, FeO(OH). This material exhibits a diffraction pattern that matches almost exactly with that of crystalline beta-$C_3N_4$. Thus, reports describing synthesis of crystalline beta-$C_3N_4$ are not conclusive, absent positive proof of the presence of the compound. Recent XPS (X-ray photoelectron spectroscopy) studies have focused on identifying the chemical state of carbon in amorphous $CN_x$ films made by plasma as described by Rossi et al. in J. Mat. Res. 9, 2440 (1994) and by Marton et al. in Phys. Rev. Lett. 73, 118 (1994) and by laser ablation techniques as described by Narayan et al. in Mater. Sci. Eng. B26, 49 (1994). They found that a significant fraction (up to approximately 40%) of the carbon atoms in the deposited films exhibits the sp$^3$ state characteristic of beta-$C_3N_4$ and yet the hardness of the films was not dramatically improved (e.g. film hardness of only 20–30 GPa). Since the films were amorphous, it appears that having the local atomic arrangement of beta-$C_3N_4$ is not a sufficient condition to achieve high hardness.

Attempts have been made to improve upon the properties of metal compounds, such as polycrystalline TiN coatings. These attempts have included variations in deposition conditions as described, for example, in Petrov et al. Thin Solid Films, 169, 299 (1989), Sproul et al. Thin Solid Films, 171, 171 (1989), and Sproul et al. Surface and Coatings Technology, 39/40, 355 (1989). The use of alternate nitrides such as HfN to this same end is described in Sproul et al., Thin Solid Films, 107, 141 (1983) and 118, 279 (1984). Doping and alloying of polycrystalline TiN coatings also have been used as described in Sproul, Suface and Coatings Technology, 36, 191 (1989), Hakansson et al., Thin Solid Films, 153, 55 (1987), Munz et al., J. Vac. Sci. Technol., A 4, 2717 (1986), and Knotek et al., J. Vac. Sci. Technol., A 6, 2149(1988).

In the cutting tool industry, attempts have been made to improve coating properties and performance by employing a multilayer coating comprising different materials. For example, multi-layer ceramic coatings having only a few layers and/or relatively large layer thicknesses such as, for example, greater than 0.1 micron were used. A 20% increase in coating hardness was achieved for TiC/TiB$_2$ for a bi-layer repeat period of 0.15 micron as described in Movchan et al., Thin Solid Films, 97, 215(1982).

Experimental work on so-called "superlattice" coatings has involved epitaxially growing a series of extremely thin (e.g. 0.75–32 nanometers thick), single crystal layers of different layer compositions on single crystal substrates, such as single crystal MgO (100), to provide a total coating thickness of approximately 2–3 microns. For example, a series of single crystal transition metal nitride superlattice layers comprising TiN/VN in alternating sequence have been epitaxially grown on MgO (100) substrates by reactive magnetron sputtering to a total coating thickness of about 2.5 microns as described in Helmersson et al., J. Appl. Phys. 62, (2), Jul. 15, 1987. The superlattice coating thus produced was found to exhibit hardness levels 2–3 times the hardness of the counterpart transition metal nitride in homogenous or bulk form. For example, the superlattice coating exhibited a hardness of 5560 (plus or minus 1000) kg/mm$^2$ as compared to 2200 (plus or minus 300) kg/mm$^2$ and 1620 (plus or minu 200) kg/mm$^2$ for single crystal TiN and VN films. As is apparent, this work involved single crystal superlattices epitaxially grown on MgO (100) substrates in order to provide a good match to both the lattice constant and thermal expansion coefficient of TiN. Similar superlattice coating results using similar coating procedures are described in Mirkarimi et al., Appl. Phys. Lett., 57, (25), 2654 (1990).

It is an object of the present invention to provide a composite material having ultrahigh hardness, such as, for example, nanoindentation hardness greater than 40 GPa and above, wherein the composite material comprises a carbon nitrogen compound deposited on a particular metal or metal compound that is effective to promote deposition of the carbon nitrogen compound in substantially crystalline form.

It is another object of the present invention to provide a composite material having ultrahigh hardness, wherein the composite material comprises a carbon nitrogen compound deposited on a particular metal or metal compound in alternating layer sequence under deposition conditions that produce substantially crystalline carbon nitrogen compound layers or phases.

It is another object of the present invention to provide a composite material having ultrahigh hardness, wherein the composite material comprises a carbon nitrogen compound deposited on a metal compound in alternating layer sequence to form a multi-layered structure that exhibits a collective hardness substantially exceeding that of each individual layer component.

It is a further object of the present invention to provide a method for producing such composite materials having ultrahigh hardness on a variety of coating substrate materials including tool materials.

SUMMARY OF THE INVENTION

The present invention provides a composite material having ultrahigh hardness, such as, for example, nanoindentation hardness that is greater than about 40 GPa and above, that approaches the hardness of a diamond thin film. The composite material comprises a carbon nitrogen compound, such as, for example, $CN_x$ where x is greater than 0.1 and up to 1.33, deposited on a metal or metal compound as a seed or template material selected effective to promote deposition of a substantially crystalline carbon nitrogen compound. The carbon nitrogen compound is deposited on a crystal plane of the metal or metal compound sufficiently lattice-matched with a crystal plane of the carbon nitrogen compound that the carbon nitrogen compound is substantially crystalline as deposited.

The metal seed material can be selected from the group consisting of a Group IIB, IIIB, IVB, VB, VIB, and VIIB metal, metalloid, and transition metal of the Periodic Table. The metal compound seed material can be selected from the group consisting of a metal nitride, metal carbide and metal carbonitride.

The deposition of the carbon nitrogen compound on the metal or metal compound can be repeated to form a plurality of alternating layers of the compounds wherein the metal or metal compound layers have a thickness controlled and repeated sufficiently in number to maintain the carbon nitrogen compound susbtantially crystalline as deposited.

The composite material may comprise a plurality of alternating layers comprising the carbon nitrogen compound each deposited on a respective layer of metal or metal compound to form a multi-layered, superlattice coating wherein each layer is ion bombardment densified during deposition and each layer has a thickness in the range of about 0.5 nm to about 100 nm (nanometer). Such a coating exhibits a hardness substantially exceeding (e.g. 2 times) the hardness of each individual layer in homogenous form.

The composite material alternately may comprise a non-layered composite material having a microstructure including phase regions comprising the carbon nitrogen compound and phase regions comprising the metal or metal compound.

A method embodiment of the present invention to make a composite material having high hardness comprises depositing a carbon nitrogen compound on a metal or metal compound seed material of the type described hereabove, wherein the carbon nitrogen compound is deposited on a crystal plane of the the metal or metal compound sufficiently lattice-matched with a crystal plane of the carbon nitrogen compound (e.g. up to 10% lattice mismatch) that the carbon nitrogen compound is substantially crystalline as deposited.

The deposition can be repeated to form a plurality of alternating layers of the compounds wherein the metal or metal compound layers have a thickness controlled and repeated sufficiently in number to maintain the carbon nitrogen compound susbtantially crystalline as deposited.

The deposited layers are ion bombardment densified as they are deposited so as to be substantially free of voids. The layers can be ion bombardment densified by applying a negative biasing voltage to a substrate on which the layers are deposited. Alternately, the layers can be ion bombardment densified by biasing the subtrate with bipolar (negative and relatively positive) voltage pulses.

The aforementioned objects and advantages of the present invention will become more readily apparent from the following detailed description and the following drawings.

DESCRIPTION OF THE DRAWINGS

FIG. 2 is a front elevation of one cathode target of the apparatus of FIG. 1, the other opposing cathode target being identical except for composition.

FIG. 3 is a front elevation of one magnetron assembly, the other being opposing magnetron being identical except that the opposing magnet poles have opposite polarity.

FIG. 4 is an exploded side elevation of one cathode target and associated magnetron.

FIG. 6 is a graph of nanoindentation hardness of composite coating material of the invention versus substrate rotational speed relative to the sputter targets.

FIG. 7 is a graph of nanoindentation hardness of composite coating material of the invention versus nitrogen partial pressure.

FIG. 8 is a graph of nanoindentation hardness of composite coating material of the invention versus substrate bias voltage.

FIG. 9 is a low-angle X-ray diffraction spectrum of composite coating material of the invention deposited at different rotational speeds of the substrate relative to the sputter targets.

FIG. 10 is a high resolution transmission electron micrograph of the cross-section of composite coating material of the present invention made at a substrate rotational speed of 12 rpm showing a predominantly crystalline coating microstructure for the $CN_x$ and TiN layers, the layers being substantially free of voids.

DETAILED DESCRIPTION OF THE INVENTION

Figure 1:
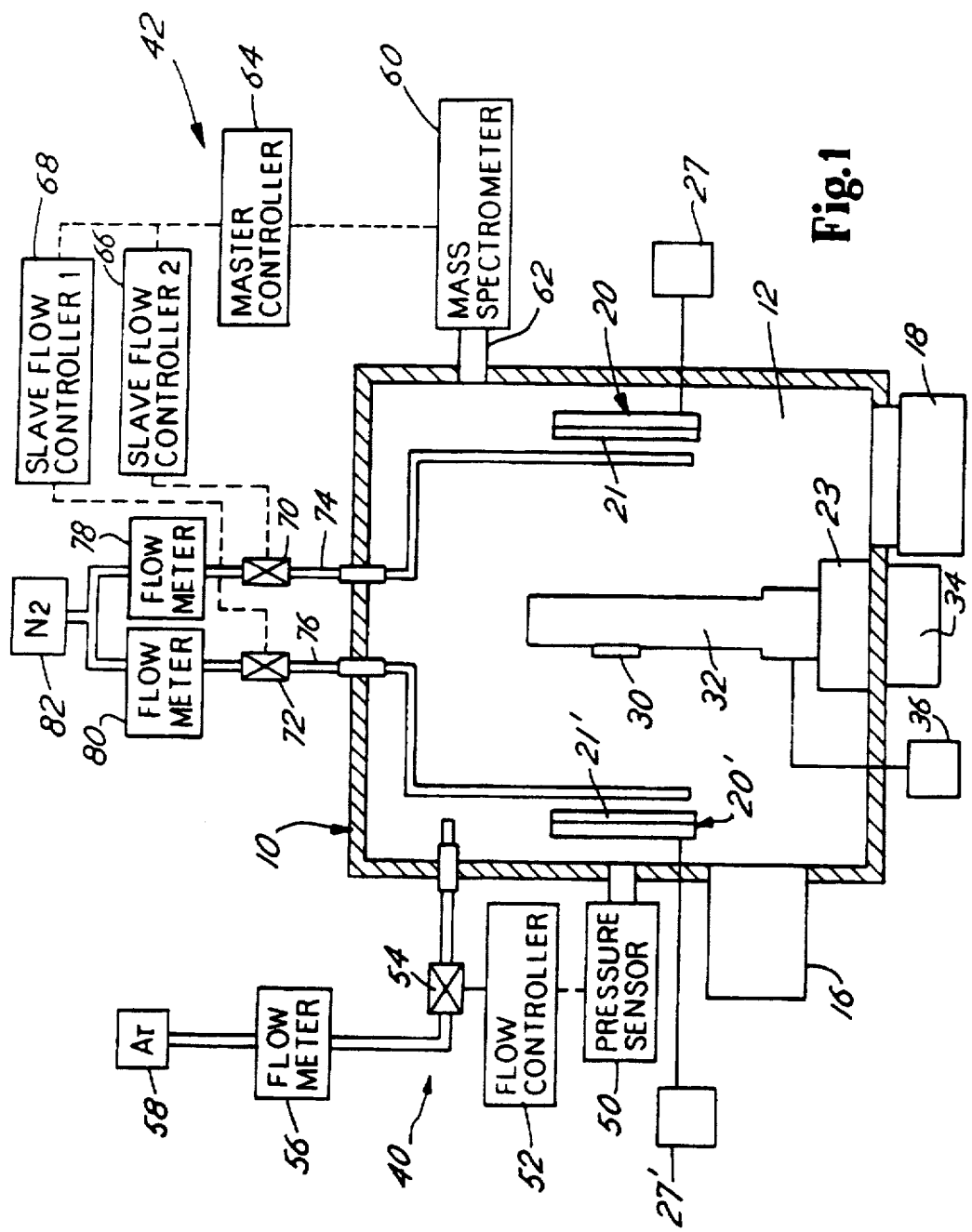
FIG. 1 is a schematic view of an opposed dual-cathode unbalanced magnetron sputter deposition apparatus useful for practicing a reactive sputter method embodiment of the invention.

Referring to FIGS. 1–5, an opposed-cathode unbalanced magnetron reactive sputtering apparatus useful for practicing the invention is schematically illustrated as including a stainless steel coating vessel 10 defining a vacuum coating chamber 10 (about 66 centimeter in diameter and 70 centimeter in height). The chamber 12 is evacuable to high vacuum levels (e.g. $1\times10^{-6}$ Torr) by a 2400 liter/second diffusion pump backed by a 38 liter/second mechanical pump designated collectively by reference numeral 16 and/or by a 1500 liter/second turbomolecular pump backed by a roots blower and mechanical pump combination having a combined pumping speed of 68 liters/second and designated collectively by reference numeral 18. The coating vessel 10 is surrounded by a water jacket (not shown). When the chamber 12 is open and during vessel pumpdown (evacuation), hot water is pumped through the jacket to reduce the amount of water vapor accumulated on the internal vessel walls. During coating deposition, cold water is pumped through the jacket to reduce the amount of water vapor released from the internal vessel walls.

Figure 5:
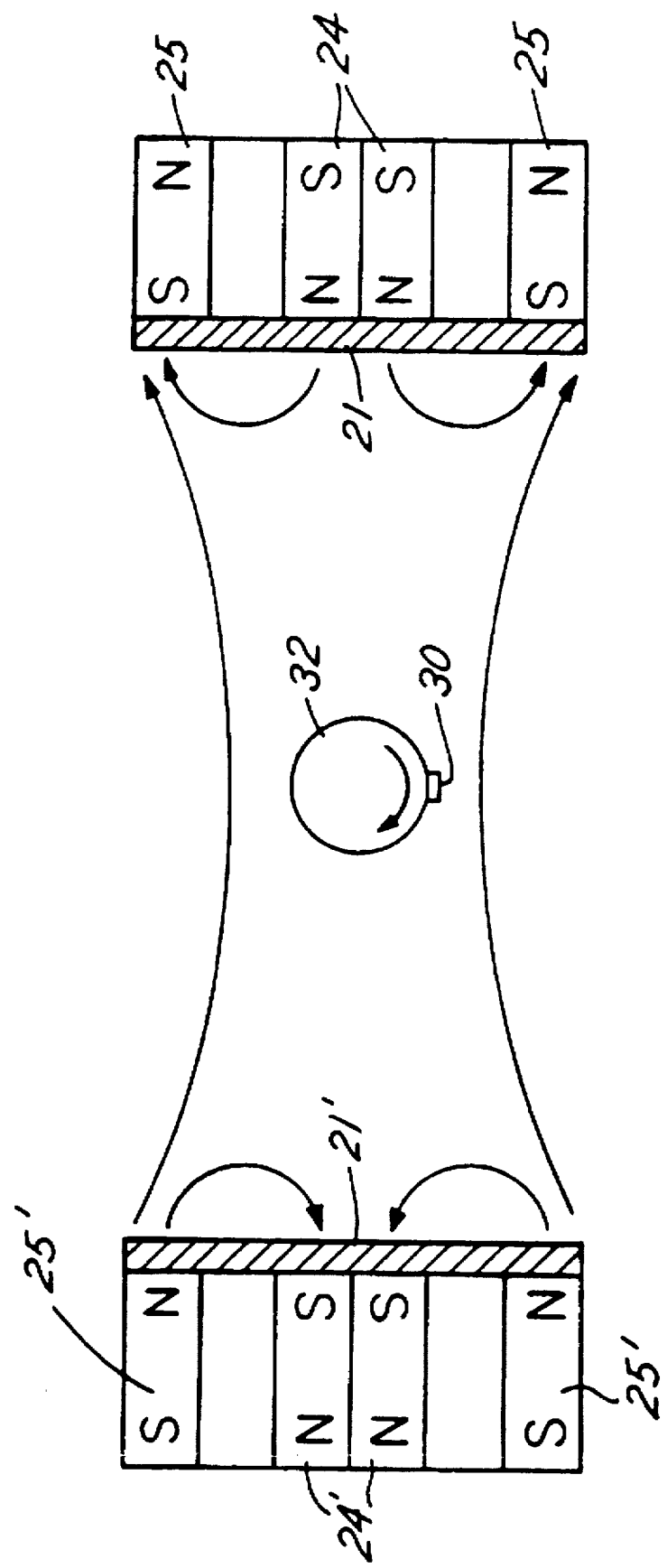
FIG. 5 is a schematic top view of the unbalanced magnetron cathodes of FIG. 1.

The apparatus includes opposing (facing) planar magnetron cathodes 20,20' of like construction (except for magnet polarity) supported in chamber 12 by cathode support housings (not shown) mounted on the walls of the vessel 10 so that the cathodes are separated by a distance of 28 centimeters. The magnetron cathodes 20,20' are shown in more detail in FIGS. 2–5 as comprising respective race track-shaped targets 21, 21' having a rectangular outer profile (12.1×38.1 centimeters) and a central opening 21a, 21a'. The targets 21,21' are received in respective tracks 23,23' of the cathodes. The tracks 21,21' are defined by respective longitudinally aligned pairs 24,24' of AlNiCo magnets that occupy the openings 21a,21a' in the targets and outer, periheral NdFeB magnets 25,25' supported on soft iron back plates 26, 26' having handles 26a, 26a'. The outer, peripheral NbFeB magnets 25,25' provide a stronger magnetic field than the weaker AlNiCo magnets 24,24'. The opposing poles of the magnets 24 and 24' and the opposing poles of the magnets 25,25' are arranged to have opposite polarity to provide a so-called opposed or closed-field configuration wherein the magnetic field lines are linked between the cathodes 20,20' as illustrated in FIG. 5 so as to increase the ion current density to the substrate to be coated. Dual unbalanced magnetron cathodes of the type described are available from Material Research Corporation (MRC) under the trademark INSET planar magnetron cathodes. Such magnetron cathodes are disclosed by Sproul et al. in Surface and Coatings Technology, 43/44, 270-278 (1990) and Rohde et al. in Surface and Coatings Technology, 50, 255-262 (1992), the teachings of both of which are incorporated herein by reference. Each target 21,21' receives electrical power from a respective 20 kW DC power supply 27,27'.

A substrate 30 to be coated is mounted on a cylindrical substrate holder 32 located equidistant from each target 21,21'. The substrate holder 32 is rotatable by a suitable electric motor 34 located outside the vessel 10 at the bottom of the vacuum chamber. The motor 34 includes a drive shaft (not shown) extending sealingly through the vessel wall to drive a substrate holder drive gear/chain mechanism 23 (shown schematically) to rotate the holder 32. The rotational speed of the subtrate holder and the target power determine the period, lambda ($\lambda$), of the layers formed one atop the other as a lamellar composite coating material on the substrate 30. For the magnetron cathode dimensions set forth hereabove, the substrate holder 32 has a diameter of 13.3 centimeters or greater and height of 40 centimeters. The substrate holder diameter is selected to be greater than the lateral dimension of the targets to minimize line-of-sight cross-contamination of one target by the other and contamination of the layers being formed proximate each target by sputtered flux from the other target. The substrate holder and substrate are electrically biased by a 5 kW DC power supply 36 (or optional 3 kW RF power supply) in order to effect initial substrate etching for substrate surface cleaning purposes and subsequent substrate biasing during coating deposition. A constant electrical power level is supplied to the substrate 30 during coating deposition in accordance with U.S. Pat. No. 4,428,811, the teachings of which are incorporated herein by reference. The substrate 30 is heated only by interaction with the plasma during sputter deposition, although a substrate heater device could be employed if desired.

To achieve high-rate reactive sputtering of ion bombarded, layer sequences on the substrate 30, reactive sputtering is conducted in an inert gas/reactive gas (e.g. $Ar/N_2$) atmosphere using an automatic, closed loop feedback control system 40 to maintain a constant total inert gas/reactive gas (e.g. $Ar/N_2$) pressure in the coating chamber 12 via inert gas (e.g. Ar) partial pressure adjustment and an automatic, closed loop feedback control system 42 to independently control reactive gas (e.g. $N_2$) partial pressure proximate each target 21,21' and to maintain the sum of the reactive gas partial pressures substantially constant during sputtering.

The pressure control system 40 comprises a capacitance manometer sensor 50 available under the trademark BARATRON from MKS Instrument Inc. connected to a flow controller 52 also available from MKS Instrument Inc. as model 260MFC mass flow controller. The flow controller 52 regulates an inert gas flow valve 54 to admit inert gas to the coating chamber 12 from a conventional mass flow meter 56 to maintain a constant total inert gas/reactive gas (e.g. $Ar/N_2$) pressure. Mass flow meter 56 receives ultra high purity inert gas gas (e.g. greater than 99.999% pure Ar) from a conventional source 56, such as an inert gas cylinder or bottle. A total gas pressure control system of the type described is disclosed by Sproul et al. in Thin Solid Films, 171, 171 (1990), the teachings of which are incorporated herein by reference.

The reactive gas (e.g $N_2$) partial pressure control system 42 may comprise a differentially pumped quadrupole mass spectrometer 60 available as Quadrex 100 mass spectrometer from Leybold Inficon Inc. communicated to the coating chamber 12 by conduit 62 to sample the sputtering atmosphere during coating deposition and provide a control signal which varies as a function of the concentration of the reactive gas (e.g. $N_2$) in the chamber 12. The sampling conduit 62 can be located equidistantly from the targets 21,21' for sampling purposes (conduit 62 is shown out of position in FIG. 1 for the sake of convenience and clarity of other features in that figure).

When used, the mass spectrometer 60 determines (senses) the inert gas and reactive gas partial pressures during coating deposition and, as mentioned, generates a control signal which varies as a function of the reactive gas partial pressure in the coating chamber 12. The control signal is supplied to a master controller 64 available as model 260MFC from MKS Instruments Inc. The master controller 64, in turn, is interfaced to separate slave flow controllers 66,68 also available as model 260MFC from MKS Instruments Inc. The slave flow controllers 66,68 can regulate respective flow control valves 70,72 that control flow of reactive gas through supply conduits 74,76 from respective mass flow meters 78,80 and a source 82 of ultra high purity reactive gas (e.g. greater than 99.999% pure $N_2$). As shown best in FIGS. 1 and 4, the conduits 74,76 extend in front of the respective target 21, 21' (e.g. by a distance of 2 centimeters) and have a rectangular peripheral profile complementary to that of the respective target, although slightly enlarged. The conduits 74, 76 include 0.5 millimeter diameter perforations spaced apart by 5 centimeters along the portions of the conduits in front of each target, to supply the reactive gas proximate thereto for reaction with the material sputtered from the targets.

The slave flow controllers 66,68 are responsive to the master controller 64 to independently control reactive gas flow and thus partial pressure proximate each target 21,21' during sputtering of material from each target 21, 21'. The slave flow controllers 66,68 can control the valves 70,72 to maintain different partial pressures at each target 21, 21' as necessary to form different layer compositions in front of each target for deposition on the substrate 30. The slave flow controllers 66,68 can maintain the ratio of reactive gas partial pressure between the targets substantially constant such that the sum of those partial pressures also will be maintained substantially constant. This control of the sum of the reactive gas partial pressures at a constant level is advantageous to achieve high rate sputter deposition of the layers wherein deposition is conducted at the optimum position (i.e. at the knee) of the hysteresis curve of reactive gas (e.g. nitrogen) partial pressure versus reactive gas flow rate as described in U.S. Pat. No. 4,428,811 and in Thin Solid Films, 171, 171 (1990), the teachings of both of which are incorporated herein by reference.

Alternately, an optical gas controller also available from Leybold Inficon Inc. can be used to measure and control nitrogen partial pressure in the coating chamber 12. For example, in the following Example set forth below, the optical gas controller was model OGC 1 from Leybold Inficon Inc. and measured the nitrogen partial pressure in the coating chamber 12 by electron impact emission spectroscopy during deposition and supplied a feedback signal representative of nitrogen partial pressure to a nitrogen flow controller. The overall nitrogen pressure in the chamber was maintained constant by the nitrogen flow controller where the nitrogen was bled into the system (coating chamber 12) through one of the gas supply conduits 74, 76 located proximate the carbon (graphite) target. The flow control valve (70 or 72) for the graphite target was operative to admit nitrogen proximate the graphite target to help promote formation of $CN_x$. The nitrogen gas for formation of TiN proximate the Ti target was provided by nitrogen gas diffusion in the coating chamber 12.

The present invention provides a composite material having ultrahigh hardness, such as, for example, nanoindentation hardness that is greater than about 40 GPa and above, such as, in the range 45 to 55 GPa, that is in the hardness range of crystalline BN and approaches the hardness of diamond thin films (e.g. 70 to 100 GPa). The composite material comprises a carbon nitrogen compound deposited under ion bombardment conditions on a metal or metal compound used as a seed or template material selected effective to promote or seed deposition of a substantially crystalline carbon nitride compound having the atomic formula $CN_x$ where x is greater than 0.1 and up to 1.33, a value of x that corresponds to the stoichiometrc beta-$C_3N_4$.

The metal seed material is selected from the group consisting of a Group IIB, IIIB, IVB, VB, VIB, and VIIB metal, metalloid, and transition metal of the Periodic Table. A particular metal seed material to this end comprises Ti, Zr, Hf or others. The metal compound seed material is selected from the group consisting of a metal nitride, metal carbide and metal carbonitride. A particular metal compound seed material to this end comprises TiN, HfN, ZrN, NbN, or others. The metal or metal compound seed material is selected to have at least one low free energy crystal plane that is sufficiently lattice-matched to at least one low free energy crystal plane of crystalline carbon nitride compound such that the carbon nitride compound is vapor phase deposited in substantially crystalline form. In practicing the invention, the low free energy crystal plane of the metal or the metal compound seed layer(s) preferably will have a lattice mismatch not exceeding about 10% with a low free energy crystal plane of the carbon nitride compound to this end.

Crystalline TiN can be used as a preferred metal compound seed material on which to deposit the carbon nitride compound as a substantially crystalline material. For example, the TiN (111) surface has a hexagonal symmetry which is the same as that of beta-$C_3N_4$ (0001). Since the TiN (111) unit vector is 2.99 Angstroms, one unit vector (one unit vector =6.44 Angstroms) of beta-$C_3N_4$ (0001) would fit into two unit vectors of TiN (111) with a lattice mismatch of about 7%. This small lattice mismatch should facilitate the nucleation of crystalline beta-$C_3N_4$.

At the interface of $CN_x$/TiN, the formation of TiC or TiCN phases is feasible. Both TiC and TiCN have the same crystal structure as TiN, but with larger lattice parameters. If TiC is formed, the lattice mismatch will be reduced to about 5%. However, because of this lattice strain, an elastic strain energy theoretically can build up, increasing with thickness of the coating in accordance with the relationship $\frac{1}{2} Et^2$, where E is the Young's modulus of the coating and t is the coating thickness. Beyond some critical coating thickness, this elastic strain energy can exceed the energy to create an interfacial dislocation so that the beta-$C_3N_4$ crystalline structure may no longer be stable.

As a result, the present invention provides periodic replenishment of the metal or metal compound seed layer material (e.g. the TiN layer) sufficiently often in the composite material to promote or force deposition of substantially crystalline carbon nitride while minimizing amorphous carbon nitride. For example, in this embodiment of the invention, periodic replenishment of the metal or metal compound seed layer involves repeating the deposition of carbon nitride on the seed layer in sequence to form a plurality of alternating layers of the carbon nitride and the metal or metal compound seed layer, wherein the metal or metal compound seed layers have a thickness controlled and repeated in number as often as necessary to maintain the carbon nitride compound susbtantially crystalline as deposited. For example, the composite material may comprise a plurality of alternating layers comprising the carbon nitrogen compound each deposited on a respective layer of metal or metal compound to form a multi-layered, superlattice coating. Furthermore, the conditions or parameters of the vapor phase deposition process are controlled to further promote or force deposition of the carbon nitride as a substantially crystalline phase or layer. With reference to the reactive sputtering apparatus described hereabove, one of the targets 21, 21' comprises carbon (e.g. graphite) that will react in the vapor phase to form the carbon nitride to be deposited, while the other target comprises a metal (e.g. Ti) that will react in the vapor phase to form an appropriate metal compound (e.g. TiN) sufficiently lattice matched to crystalline carbon nitride compound to promote deposition thereof. For example, such reactive sputter deposition parameters as the total gas pressure, reactive nitrogen gas partial pressure, target power and composition, and substrate bias voltage are controlled to deposit substantially crystalline carbon nitride (i.e. $CN_x$) on the metal or metal compound seed material. By controlling these parameters, the invention can produce superhard composite materials including compounds of crystalline carbon nitride and other metal nitrides, carbides, or carbonitrides. Under preferred deposition parameters and lattice match parameters, multilayered, superlattice type composite coating materials comprising alternating layers having individual layer thickness of about 0.5 to about 100 nm and comprising substantially crystalline carbon nitride layers and a metal or metal compound seed layers in alternating sequence can be produced with the substrate at or near room temperature to achieve a collective coating nanoindentation hardness in the range of 45 to 55 GPa and a Young's modulus of up to 550 GPa.

The reactive sputter deposited carbon nitride layers and alternating metal or metal compound seed layers are ion bombardment densified as they are deposited so as to be substantially free of voids. The layers can be ion bombardment densified by applying a negative biasing voltage to a substrate on which the layers are deposited. Alternately, the layers can be ion bombardment densified by biasing the subtrate with negative DC voltage or bipolar (negative and relatively positive) voltage pulses. Alternately, the reactive sputter deposition parameters can be controlled to form a composite coating material having a non-layered microstructure including phase regions comprising substantially crystalline carbon nitride compound and phase regions comprising a metal or metal compound dispersed throughout the microstructure.

The following Examples are offered for purposes of illustrating the invention in greater detail rather than limiting the present invention.

For example, deposition of composite coating materials of the invention on Si wafer (100) and M-2 tool steel substrates during each coating trial was conducted using the reactive sputter deposition apparatus described in detail hereabove operated under the aforementioned controlled parameters to produce substantially crystalline carbon nitride layers sandwiched between substantially crystalline TiN layers. The sputter targets were graphite and Ti.

Control of differential nitrogen partial pressure was achieved using the optical gas controller (OGC) in the manner referred to hereabove.

The width of the substrate holder 30 was 13.3 centimeters, greater than the target width of 12.1 centimeters to help eliminate line-of-sight cross contamination and reduce gas-scattering effects. The ion bombardment of the layers as they were deposited was induced by applying a negative DC bias voltage on the substrate holder 30 during deposition of the layers.

The substrates on which the composite coating materials were deposited comprised Si (100) wafer (2 cm by 2 cm in dimensions) and polished M-2 tool steel (2.5 cm by 2 cm by 0.6 cm in dimensions). The surface roughness of the Si wafer and M-2 tool steel substrate was 1 nm and 5 nm, respectively. The substrates were solvent cleaned before being placed in the sputtering chamber 12. DC sputter etching of each substrate was begun when the sputtering chamber pressure was less than $1 \times 10^{-6}$ Torr. The argon pressure during etching was $3 \times 10^{-2}$ Torr, the etching time was 10 minutes, and the etching voltage was −900 volts DC.

After etching, deposition of the composite coating material on the etched substrate was initiated in the mixed Ar—$N_2$ discharge. The total gas pressure ($P_{N2+Ar}$) was $8 \times 10^{-3}$ Torr. Up to 5 kW of power was supplied to each target. Periodic replenishment of the TiN seed layer was achieved by rotating the substrate holder 30 such that the substrate was alternately exposed to the Ti target and graphite target. The speed of rotation of the substrate holder 32 was used to control the bilayer thickness of the TiN seed layer and $CN_x$ layer. The relative layer thickness was adjusted by regulating the power to each target.

The total coating thickness deposited on the substrates was about 2 microns for a typical deposition time of 40 minutes. Typical r.m.s. surface roughness of the coatings deposited on M-2 tool steel substrates was 6–7 nm over an area of 0.5 by 0.5 microns as determined by an atomic force microscope (AFM).

The composite coating materials deposited on the substrates were measured for coating thickness with a Calotester available from CSEM, Switzerland. The microhardness of the coating material was measured by a commercially available UMIS-2000 nanoindentation (ultramicroindentation) system available from CSIRO Industrial Research Organization, Sydney, Australia, with a three-faced Berkovich indentor using a maximum load of 20 mN (milliNewton).

This hardness measuring system measures surface mechanical constants by direct measurement of indentor penetration as function of load, under milligrams conditions. In particular, this system uses a sharp diamond indentor with a minimum force of 0.1 mN. The force and penetration depth are measured accurately to provide hardness and elastic modulus (E) information for very thin coatings. The depth of resolution is 1 nm. This system was used for coatings of thickness of about 2 microns since at this coating thickness level, the Vickers microhardness test also conducted is affected by soft substrate effects in the hardness measurement. The nanoindentation hardness test results were confirmed by nanoindentation hardness tests conducted at the Oak Ridge National Laboratory.

The composite coating materials were subjected to X-ray diffraction studies using a Scintag XDS 2000 PAD V diffractometer with Cu K alpha radiation. The operating voltage was 40 kV and tube current was 40 mA. The microstructure of several composite coatings were studied using a Hitachi-2000 analytical transmission electron microscope (TEM) operated at 200 kV. The chemical composition of the coatings was obtained by in-situ energy-dispersive X-ray analysis (EDX) and electron energy loss spectroscopy (EELS). The TABLE below sets forth deposition parameters employed to deposit $CN_x$/TiN composite coatings of the invention on both the Si and M-2 tool substrates during each coating trial and certain characterization data of these composite coatings on formed such substrates. The major deposition parameters set forth in the TABLE include the nitrogen partial pressure, $P_{N2}$, substrate bias voltage and current, Bias V and I, relative target power level of C/Ti, Power Ti/C, which determines the relative layer thickness between $CN_x$ and TiN), and rotation speed of the substrate holder table (which determines bi-layer thickness). In the TABLE, Lc is adhesion critical load, Period is the bilayer period, OGC is the optical gas controller setting representative for nitrogen partial pressure, and Q is a value of the mass spectrometer that can be converted to nitrogen partial pressure.

The characterization data set forth in the TABLE for composite coatings of the invention are mostly for M-2 steel substrates (although the coating properties generally are the same on Si substrates) and include coating thickness in microns, Vicker microhardness, H, in $kg/mm^2$, nanoindentation hardness, H, in GPa using the UMIS system, elastic modulus, E, in GPa, penetration depth in nm using the UMIS nanoindentor, and XRD comments.

comparable thickness on like substrate under like conditions was only 20 GPa.

FIG. 7 illustrates the variation nanoindentation hardness versus nitrogen partial pressure at each target for coatings deposited with a substrate bias voltage of −150 V DC and substrate holder table rotational speed of 12 rpm. The nitrogen partial pressure of 0.2 mTorr corresponded that used to produce the aforementioned single stoichiometric TiN having the hardness of 20 GPa and the single $CN_x$ layer having the hardness of 20 GPa. Increasing of the nitrogen partial pressure beyond 0.2 Torr resulted in overstoichiometric TiN layers and soft TiN.

The effect of substrate bias voltage on nanoindentation hardness of the composite coatings is shown in FIG. 8 where it can be seen that coating hardness increased dramatically to 45 to 55 GPa when the substrate bias voltage was increased to −150 V DC. The hardness slightly decreased with further increases in the substrate bias voltage level. A

TABLE

| Data D/M-R | Time min | Thick ness μm | H kg/ mm² | Lc kg | Period A nm | Power Ti/C kW | Bias V -V | Bias I A | Table Speed RPM | OGC 10⁻⁴ | Q 10⁻⁴ | $P_{N2}$ mTorr | UMIS H GPa | UMIS E GPa | UMIS Depth 20 mN nm | XRD Comments |
|---|---|---|---|---|---|---|---|---|---|---|---|---|---|---|---|---|
| 11/18-1 | 40 | 2.0 | 2000 | 1–2 | 4.2 | 5/4.5 | 150 dc | 5.04 | 12 | 3.0 | 1.8 | 0.26 | 42.7 | 678.6 | 133.6 | Low angle = 3.65 mm (111)2.509 (200)2.151 |
| 11/18-2 | 40 | 1.86 | 2500 | 1–2 | 3.9 | 5/4.5 | 150 dc | 5.08 | 12 | 2.0 | 1.6 | 0.17 | 48.1 | 741.0 | 125.0 | Low angle = 4.41, 2.32 (111)2.517 |
| 11/18-3 | 40 | 2.27 | 2300 | <1 | 4.7 | 5/4.5 | 150 dc | 5.00 | 12 | 4.0 | 2.7 | 0.36 | 32.7 | 535.4 | 156.1 | |
| 11/18-4 | 40 | 2.2 | 2250 | 1–5 | 4.6 | 5/4.5 | 150 dc | 5.00 | 12 | 2.5 | 2.4 | 0.24 | 38.1 | 851.5 | 134.4 | |
| 11/21-1 | 40 | — | — | — | | 5/4.5 | 150 dc | 4.98 | 2 | 2.0 | 1.3 | 0.19 | 15.6 | 794.3 | 209.5 | 2Theta = none low angle = no |
| 11/21-2 | 40 | — | — | — | | 5/4.5 | 150 dc | 5.08 | 6 | 2.0 | 1.4 | 0.18 | 17.9 | 568.6 | 201.7 | 2Theta = none low angle = 5.52, 3.88 |
| 11/22-1 | 40 | 1.88 | 1825 | 1–2 | 2.0 | 5/4.5 | 150 dc | 5.02 | 24 | 2.0 | 1.2 | 0.18 | 42.1 | 868.1 | 127.9 | Low angle = No |
| 11/22-2 | 40 | 1.26 | 1386 | 1–2 | 2.6 | 3/4.5 | 150 dc | 3.62 | 12 | 2.0 | 1.3 | 0.17 | 34.4 | 455.5 | 158.9 | Low angle = 3.08,1.58 (111)2.504 (200)2.511 |
| 11/22-3 | 60 | 8.63 | 1564 | 2–3 | 1.3 | 1/4.5 | 158 dc | 2.16 | 12 | 2.0 | 1.3 | | 20.0 | 379.0 | 202.3 | 2Theta = none low angle = no |
| 11/22-4 | 40 | 1.72 | 2187 | 1–2 | 3.6 | 5/1 | 150 dc | 3.98 | 12 | 2.0 | 1.3 | | 35.1 | 298.8 | 140.6 | Low angle = no (111)2.494 |
| 11/23-1 | 40 | 2.25 | 2151 | 1–2 | 4.7 | 5/4.5 | 100 dc | 5.08 | 12 | 2.0 | 1.2 | 0.17 | 29.0 | 634.3 | 159.2 | |
| 11/23-2 | 40 | 2.5 | 2.89 | 2–3 | 5.2 | 5/4.5 | 200 dc | 5.2 | 12 | 2.0 | 1.2 | | 47.1 | 757.6 | 125.2 | |
| 11/23-3 | 40 | 1.75 | 2022 | 1–2 | 3.6 | 5/4.5 | 250 dc | 5.38 | 12 | 2.0 | 1.3 | | 46.2 | 680.9 | 129.0 | |
| 11/23-4 | 40 | 2.29 | 2974 | <1 | | 5/4.5 | 0–380 | | 12 | 2.0 | | | | | | |

FIG. 6 illustrates the variation of coating nanoindentation hardness as a function of the substrate holder table rotational speed for coatings deposited with nitrogen partial pressure of 0.2 mTorr and substrate bias voltage of −150 volts DC. The nanoindentation hardness of the composite coating was between 40 to 50 GPa at a rotational speed of 12 rpm and greater. The hardness drops with a decrease in the table rotational speed. For comparison purposes, the nanoindentation hardness of a single TiN layer of comparable thickness deposited on a like substrate under like conditions was only 20 GPa. A carbon nitride coating, $CN_x$, deposited to a substrate bias voltage of −150 V produced ion bombardment densification of the coating layers to the extent that the layers are free of voids, e.g. see FIG. 10.

FIG. 9 illustrates individual low angle XRD spectrum for composite coatings deposited at 3 different substrate table rotational speeds. No distinct diffraction peaks were observed at the rotational speed of 24 rpm, indicating that there was no layered structure in the deposited coating although contrast was found in a high resolution TEM of the coating structure suggesting the difference of electron density due to the mass difference of high mass of Ti(C)N and the low mass of $CN^x$. The high nanoindentation hardness (42.1 GPa) for the non-layered coating produced at 24 rpm, which is comparable to the layered coatings produced at 12 rpm, may be due to nanocrystalline $CN_x$ phase of extreme hardness and the densification of the coating by ion bombardment. The composite coatings produced at the 2 lower table rotational speeds exhibited diffraction peaks indicative that there were distinct layers present in the coating.

High resolution TEM of a cross-section of a composite coating (sample 11/18-2) produced at 12 rpm substrate holder rotational speed is shown in FIG. 10. The TEM shows that the coating is 100% crystalline. The average coating composition was obtained using both EDX and EELS and was found to include Ti, N, and C. The impurity level was very low, if any. Because of the limitation of spatial resolution of the electron beam, no nm size coating composition could be obtained.

High resolution TEM of the composite coating structure produced at the lower substrate holder table rotational speed of 6 rpm indicated a clearly layered coating structure with most (e.g. 90%) of the coating areas examined being crystalline.

The composite coating materials described in the above Example comprising substantially crystalline carbon nitride deposited on TiN offer several advantages over diamond thin films or coatings. For example, the composite coating materials of the invention can be produced at substrate temperatures at or near room temperature. For example, the M-2 substrate temperature in the Examples was only 150 degrees C. Thus, the composite coating materials of the invention can be deposited on many conventional engineering materials including different types of steels. Moreover, the composite coating of the invention generally replicates the topography of the substrate. This is advantageous for coating smooth substrate surfaces when maintaining the smoothness on the coating surface is important. Moreover, a coating method embodiment of the invention where the composite coating is deposited by reactive magnetron sputtering can be scaled up for industrial applications where high coating deposition rates are desired.

While the invention has been described in terms of specific embodiments thereof, it is not intended to be limited thereto but rather only to the extent set forth in the following claims.

We claim:

1. A composite material having high hardness, comprising a plurality of layers comprising a carbon nitrogen compound in alternating sequence with a metal or metal compound as a seed material, said carbon nitrogen compound being deposited on a crystal plane of said metal or said metal compound sufficiently lattice-matched with a crystal plane of said carbon nitrogen compound that said carbon nitrogen compound is substantially crystalline, said layers being ion bombardment densified during deposition so as to be substantially free of voids and exhibiting a collective hardness greater than a hardness of any individual layer.

2. The composite material of claim 1 wherein the metal compound seed material is selected from the group consisting of metal nitride, metal carbide, and metal carbonitride.

3. The composite material of claim 1 wherein the metal seed material is selected from the group consisting of a Group IIB, IIIB, IVB, VB, VIB, and VIIB metal, metalloid, and transition metal.

4. The composite material of claim 1 wherein said carbon nitrogen compound comprises substantially crystalline $CN_x$ where x is greater than 0.1 and up to 1.33.

5. The composite material of claim 1 exhibiting a nanoindentation hardness greater than about 40 GPa.

6. The composite material of claim 1 wherein the layers of said metal or metal compound having a thickness controlled and repeated in number sufficiently to maintain said carbon nitrogen compound susbtantially crystalline as deposited.

7. The composite of claim 1 wherein each layer has a thickness in the range of about 0.5 nm to about 100 nm.

8. The composite material of claim 1 having a collective hardness exceeding the hardness of each of said layers in homogenous form.

9. The composite material of claim 6 having a nanoindentation hardness greater than about 45 to 55 GPa.

10. A composite material having high hardness, comprising:

a carbon nitrogen compound deposited on a metal or metal compound as a seed material, said carbon nitrogen compound being deposited on a crystal plane of said metal or metal compound sufficiently laticematched with a crystal plane of said carbon nitrogen compound that said carbon nitrogen compound is substantially crystalline, said composite material having a non-layered, ion bombardment densified microstructure substantially free of voids and including phase regions comprising said carbon nitrogen compound and phase regions comprising said metal or said metal compound.

11. The composite material of claim 1 wherein said crystal plane of said metal or said metal compound has a lattice mismatch of up to about 10% with said crystal plane of said carbon nitrogen compound.

* * * * *